United States Patent
Lee et al.

(10) Patent No.: US 8,685,772 B2
(45) Date of Patent: Apr. 1, 2014

(54) METHOD OF MANUFACTURING LIGHT EMITTING DIODE AND LIGHT EMITTING DIODE MANUFACTURED THEREBY

(75) Inventors: Dong Ju Lee, Gyeonggi-do (KR); Heon Ho Lee, Gyeonggi-do (KR); Hyun Wook Shim, Gyeonggi-do (KR); Young Sun Kim, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 13/344,298

(22) Filed: Jan. 5, 2012

(65) Prior Publication Data

US 2012/0168769 A1    Jul. 5, 2012

(30) Foreign Application Priority Data

Jan. 5, 2011    (KR) .................. 10-2011-0000916

(51) Int. Cl.
*H01L 33/02* (2010.01)

(52) U.S. Cl.
USPC .. 438/37; 257/76; 257/E33.043; 257/E33.025

(58) Field of Classification Search
CPC ...................................................... H01L 33/20
USPC ................ 257/76, E33.043, E33.025; 438/37
See application file for complete search history.

(56) References Cited

U.S. PATENT DOCUMENTS

| | | | |
|---|---|---|---|
| 2005/0040413 A1* | 2/2005 | Takahashi et al. | 257/96 |
| 2005/0145860 A1* | 7/2005 | Tanizawa | 257/85 |
| 2007/0240631 A1 | 10/2007 | Nijhawan et al. | |
| 2010/0261340 A1* | 10/2010 | Nijhawan et al. | 438/478 |
| 2011/0081771 A1* | 4/2011 | Su | 438/508 |

FOREIGN PATENT DOCUMENTS

| | | |
|---|---|---|
| CN | 101335313 B | 12/2008 |
| JP | 09-295890 A | 11/1997 |

OTHER PUBLICATIONS

Chinese Office Action issued in Chinese Patent Application No. 201210001662.1 mailed Jan. 2, 2014.

* cited by examiner

*Primary Examiner* — Jarrett Stark
*Assistant Examiner* — Lawrence Tynes, Jr.
(74) *Attorney, Agent, or Firm* — McDermott Will & Emery LLP

(57) ABSTRACT

There is provided a method of manufacturing a light emitting diode and a light emitting diode manufactured by the same. The method includes growing a first conductivity type nitride semiconductor layer and an undoped nitride semiconductor layer on a substrate sequentially in a first reaction chamber; transferring the substrate having the first conductivity type nitride semiconductor layer and the undoped nitride semiconductor layer grown thereon to a second reaction chamber; growing an additional first conductivity type nitride semiconductor layer on the undoped nitride semiconductor layer in the second reaction chamber; growing an active layer on the additional first conductivity type nitride semiconductor layer; and growing a second conductivity type nitride semiconductor layer on the active layer.

13 Claims, 3 Drawing Sheets

METHOD OF MANUFACTURING LIGHT EMITTING DIODE AND LIGHT EMITTING DIODE MANUFACTURED THEREBY

CROSS-REFERENCE TO RELATED APPLICATIONS

This application claims the priority of Korean Patent Application No. 10-2011-0000916 filed on Jan. 5, 2011, in the Korean Intellectual Property Office, the disclosure of which is incorporated herein by reference.

BACKGROUND OF THE INVENTION

1. Field of the Invention

The present invention relates to a method of manufacturing a light emitting diode and a light emitting diode manufactured thereby.

2. Description of the Related Art

A light emitting diode (LED) is a semiconductor device that can emit light of various colors due to electron-hole recombination occurring at a p-n junction when a current is supplied thereto. Such an LED is advantageous over a filament-based light emitting device in that it has a long lifespan, low power usage, superior initial-operation characteristics, and high vibration resistance. These factors have continually boosted the demand for LEDs. Particularly, group III nitride semiconductors that can emit light in a blue/short wavelength region have recently drawn much attention.

Nitride semiconductor crystals, constituting a light emitting device using the group III nitride semiconductor, are grown on a sapphire or SiC substrate. In order to grow the semiconductor crystals, a plurality of gas-state sources are deposited on the substrate by a chemical vapor deposition process. The light emission performance and reliability of a semiconductor light emitting device may be greatly affected by the quality of semiconductor layers (crystallinity, doping uniformity, and the like). Here, the quality of semiconductor layers may depend on the structure, internal environment and usage conditions of a vapor deposition apparatus used for the growth of semiconductor thin films. Therefore, there is a need in this technical field for a method of improving the quality of semiconductor layers by optimizing the vapor deposition process.

SUMMARY OF THE INVENTION

An aspect of the present invention provides a method of manufacturing a light emitting diode (LED), in which a system's operational capability and productivity may be improved, while the crystallinity of semiconductor layers obtained by this method may be improved.

According to an aspect of the present invention, there is provided a method of manufacturing a light emitting diode, the method including: growing a first conductivity type nitride semiconductor layer and an undoped nitride semiconductor layer on a substrate sequentially in a first reaction chamber; transferring the substrate having the first conductivity type nitride semiconductor layer and the undoped nitride semiconductor layer grown thereon to a second reaction chamber; growing an additional first conductivity type nitride semiconductor layer on the undoped nitride semiconductor layer in the second reaction chamber; growing an active layer on the additional first conductivity type nitride semiconductor layer; and growing a second conductivity type nitride semiconductor layer on the active layer.

Part of the undoped nitride semiconductor layer may be exposed to the air during the transferring of the substrate to the second reaction chamber.

The growing of the active layer and the second conductivity type nitride semiconductor layer may be performed in the second reaction chamber.

The growing of the active layer may be performed in the second reaction chamber. The growing of the second conductivity type nitride semiconductor layer may include transferring the substrate having the active layer grown thereon to a third reaction chamber, and growing the second conductivity type nitride semiconductor layer on the active layer in the third reaction chamber.

The growing of the active layer may include transferring the substrate having the additional first conductivity type nitride semiconductor layer grown thereon to a third reaction chamber, and growing the active layer on the additional first conductivity type nitride semiconductor layer in the third reaction chamber.

The growing of the second conductivity type nitride semiconductor layer may include transferring the substrate having the active layer grown thereon to a fourth reaction chamber, and growing the second conductivity type nitride semiconductor layer on the active layer in the fourth reaction chamber.

The first conductivity type nitride semiconductor layer and the additional first conductivity type nitride semiconductor layer may be formed of the same material.

The first conductivity type nitride semiconductor layer and the additional first conductivity type nitride semiconductor layer may be formed of n-type GaN, and the undoped nitride semiconductor layer may be formed of undoped GaN.

According to another aspect of the present invention, there is provided a light emitting diode including: first and second conductivity type nitride semiconductor layers; an active layer interposed between the first and second conductivity type nitride semiconductor layers; and an undoped nitride semiconductor layer interposed within the first conductivity type nitride semiconductor layer to divide the first conductivity type nitride semiconductor layer into two regions in a thickness direction.

The first conductivity type nitride semiconductor layer may be formed of n-type GaN, and the undoped nitride semiconductor layer may be formed of undoped GaN.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
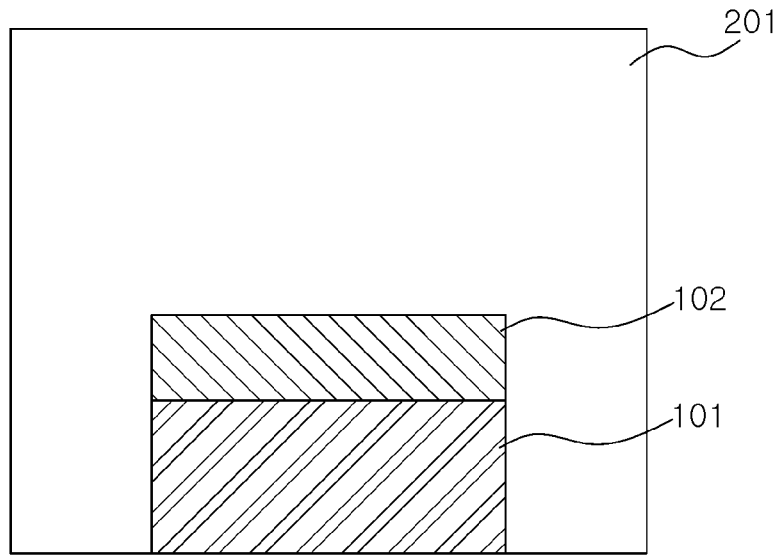
FIGS. 1 through 5 are schematic cross-sectional views illustrating a method of manufacturing a light emitting diode (LED) according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions may be exaggerated for clarity, and the same reference numerals will be used throughout to designate the same or like components.

FIGS. 1 through 5 are schematic cross-sectional views illustrating a method of manufacturing a light emitting diode (LED) according to an exemplary embodiment of the present invention. As shown in FIG. 1, a first conductivity type nitride semiconductor layer 102 is grown on a substrate 101. This operation is conducted in a first reaction chamber 201. The growth of the first conductivity type nitride semiconductor layer 102 may be performed by Metal Organic Chemical Vapor Deposition (MOCVD), Hydride Vapor Phase Epitaxy (HVPE), Molecular Beam Epitaxy (MBE), Atomic Layer Deposition (ALD) or the like. In this case, although not specifically shown, the first reaction chamber 201 may have a structure including a susceptor, in which the substrate 101 is disposed, and a gas flow path, through which a source gas is drawn.

The substrate 101 is provided for the growth of a semiconductor layer, and a substrate formed of sapphire, SiC, $MgAl_2O_4$, MgO, $LiAlO_2$, $LiGaO_2$, GaN, Si or the like may be used therefor. A sapphire substrate is formed of a crystal having Hexa-Rhombo R3c symmetry, and has a lattice constant of 13.001 Å in a C-axis and a lattice constant of 4.758 Å in an A-axis. Orientation planes of the sapphire substrate include a C (0001) plane, an A (1120) plane, an R (1102) plane, etc. In particular, the C plane is mainly used as a substrate for nitride growth as it facilitates the growth of a nitride film and is stable at high temperature.

The first conductivity type nitride semiconductor layer 102 may be formed of semiconductor materials having a composition formula $Al_xIn_yGa_{(1-x-y)}N$ ($0 \leq x \leq 1$, $0 \leq y \leq 1$ and $0 \leq x+y \leq 1$) and doped with n-type impurities such as Si or the like. However, the invention is not limited thereto. For example, the first conductivity type nitride semiconductor layer 102 may be formed of n-type GaN. Although not shown, a buffer layer such as an undoped semiconductor layer or the like may be grown before the growth of the first conductivity type nitride semiconductor layer 102 so that degradation of the crystalline characteristics of the first conductivity type nitride semiconductor layer 102 may be minimized.

Figure 2:
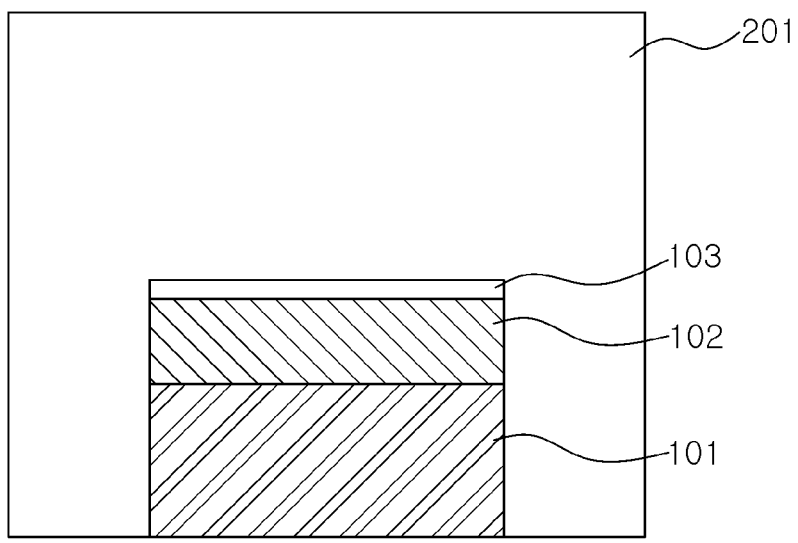

Next, as shown in FIG. 2, an undoped nitride semiconductor layer 103 is grown on the first conductivity type nitride semiconductor layer 102, which is also conducted in the first reaction chamber 201. According to the present embodiment, in a case in which two or more reaction chambers are used to grow semiconductor layers constituting a light emitting diode, the first conductivity type nitride semiconductor layer 102 may be exposed to the air during the transfer of the substrate between the reaction chambers, whereby the surface thereof may be polluted to thereby cause quality degradation. For example, in a case in which an Si-doped GaN layer is exposed to the air, an Si oxide may be created on the surface thereof. In the present embodiment, prior to the transfer of the substrate, the undoped nitride semiconductor layer 103 is grown on the first conductivity type nitride semiconductor layer 102 in the first reaction chamber 201, and an additional first conductivity type nitride semiconductor layer 104 (see FIG. 3) is then grown thereon, as will be described below. Accordingly, the first conductivity type nitride semiconductor layer 102 may be protected during the transfer of the substrate 101, whereby the generation of undesired oxides may be minimized. In this case, the undoped nitride semiconductor layer 103 may be formed of undoped GaN by way of example. Meanwhile, the term "undoped" refers to a state in which a nitride semiconductor having its own doping concentration is not intentionally doped.

Figure 3:
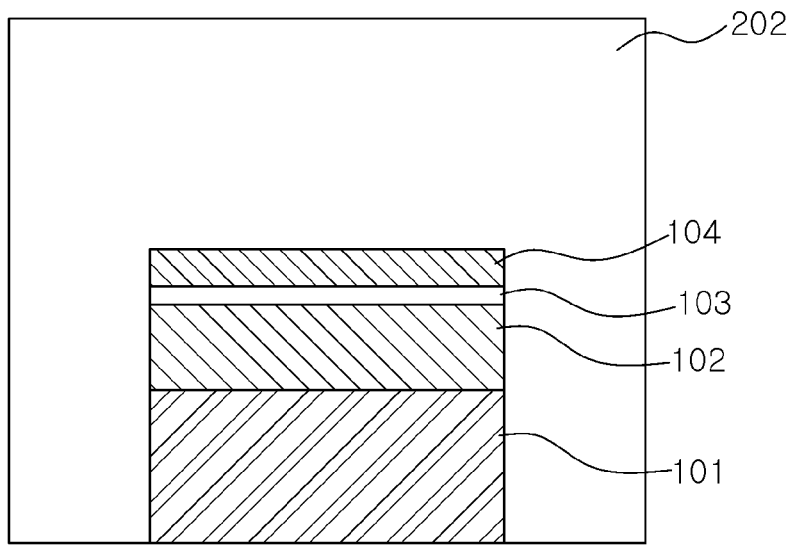

Next, as shown in FIG. 3, the additional first conductivity type nitride semiconductor layer 104 is grown on the undoped nitride semiconductor layer 103 in a second reaction chamber 202. To enable this, the substrate 101 having the first conductivity type nitride semiconductor layer 102 and the undoped nitride semiconductor layer 103 grown thereon is transferred from the first reaction chamber 201 to the second reaction chamber 202. A method of transferring the substrate 101 is not particularly limited, and the transfer process may be performed manually or by the use of a load lock chamber. The method suggested in this embodiment may be useful in a case that the transfer process is performed in a state in which the substrate is exposed to the air. In this case, as described above, the undoped nitride semiconductor layer 103 may minimize damage to the first conductivity type nitride semiconductor layer 102 that may be caused by exposure to the air during the transfer process. The additional first conductivity type nitride semiconductor layer 104 may be formed of semiconductor materials having a composition formula $Al_xIn_yGa_{(1-x-y)}N$ ($0 \leq x \leq 1$, $0 \leq y \leq 1$ and $0 \leq x+y \leq 1$) and doped with n-type impurities such as Si or the like, without being limited thereto. The additional first conductivity type nitride semiconductor layer 104 may be formed of the same material as that of the first conductivity type nitride semiconductor layer 102, and it may be formed of n-type GaN for example.

Meanwhile, in the present embodiment, two or more reaction chambers are used to grow semiconductor layers constituting a light emitting structure, thereby achieving a reduction in processing costs and time consumed in the occurrence of defects during the growth of the semiconductor layers. Specifically, in a case in which the semiconductor layers constituting the light emitting structure, e.g., the first and second conductivity type nitride semiconductor layers 101 and 106 and an active layer 105, are grown in the individual first and second reaction chambers 201 and 202 simultaneously, the individual first and second reaction chambers 201 and 202 are used for a relatively long period of time, and the amount of source gas and processing time consumed in the occurrence of defects may be relatively high as compared with the separate growth of the semiconductor layers described in the present embodiment. In addition, since an initial growth process is completed by a single deposition apparatus within a relatively short period of time, the repair and maintenance of the deposition apparatus prior to a sequential growth process may be implemented flexibly. In this case, the first and second reaction chambers 201 and 202 may employ the same deposition process, but may be different deposition apparatuses. That is, both of the first and second reaction chambers 201 and 202 may be MOCVD apparatuses, or the first reaction chamber 201 may be an HVPE apparatus and the second reaction chamber 202 may be an MOCVD apparatus. In addition, even in the case that the first and second reaction chambers 201 and 202 are MOCVD apparatuses, the structure thereof may be different. For example, the first reaction chamber 201 may allow a reactant gas to be injected in a vertical direction with respect to a susceptor, while the second reaction chamber 202 may allow a reactant gas to be injected in a direction parallel to a susceptor.

In addition to the above-described advantages, since individual semiconductor layers constituting the light emitting structure are different in conditions such as growth temperature, source gas atmosphere, and the like, the plurality of reaction chambers 201 and 202 are designed to maintain the growth conditions of individual semiconductor layers therein, thereby facilitating the management thereof and reducing the degradation thereof. In a case in which the light emitting structure is grown by the separate growth of the semiconductor layers in the reaction chambers 201 and 202 in which growth conditions are constantly maintained, the crystalline quality and doping characteristics of the individual semiconductor layers may be enhanced. For example, in a case in which the first conductivity type nitride semiconductor layer 102 includes n-type GaN, it is grown at approximately 1000° C. to 1300° C. In a case in which the second conductivity type nitride semiconductor layer 106 includes p-type GaN, it is grown at a relatively low temperature of approximately 700° C. to 1100° C., and the second reaction chamber 202 in which a growth temperature and a source gas atmosphere are suitable for the second conductivity type nitride semiconductor layer 106 is used to thereby improve the quality of the second conductivity type nitride semiconductor layer 106. Considering that the additional first conductivity type nitride semiconductor layer 104 is grown in the second reaction chamber 202, it may be difficult to constantly maintain the growth conditions in the second reaction chamber 202. Accordingly, an additional reaction chamber may be used, as will be described in the following embodiment.

Figure 4:
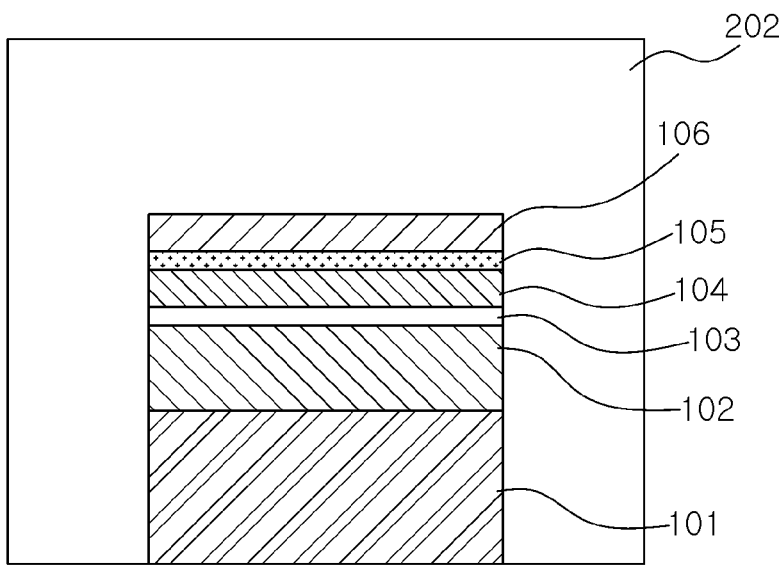

Subsequently, as shown in FIG. 4, the active layer 105 and the second conductivity type nitride semiconductor layer 106 are grown on the additional first conductivity type nitride semiconductor layer 104. This operation may be conducted in the second reaction chamber 202 without the transfer of the substrate 101, or may be performed in a separate chamber in order to maintain growth conditions suitable for individual semiconductor layers therein. The active layer 105 may be disposed between the first conductivity type nitride semiconductor layer 104 and the second conductivity type nitride semiconductor layer 106, emit light having a predetermined level of energy through electron-hole recombination, and have a multi-quantum-well (MQW) structure in which quantum well layers and quantum barrier layers are alternately stacked. The MQW structure may be a multilayer structure of $Al_xIn_yGa_{(1-x-y)}N$ (0≤x≤1, 0≤y≤1 and 0≤x+y≤1) and employ an InGaN/GaN structure, for example. In this case, the active layer 105 may be grown in the same manner as the first conductivity type nitride semiconductor layers 102 and 104 by using a process such as MOCVD or the like. The second conductivity type nitride semiconductor layer 106 may be formed of p-type nitride semiconductor materials having a composition formula $Al_xIn_yGa_{(1-x-y)}N$ (0≤x≤1, 0≤y≤1 and 0≤x+y≤1) and doped with impurities such as Mg, Zn or the like. For example, the second conductivity type nitride semiconductor layer 106 may be formed of p-type GaN.

Figure 5:
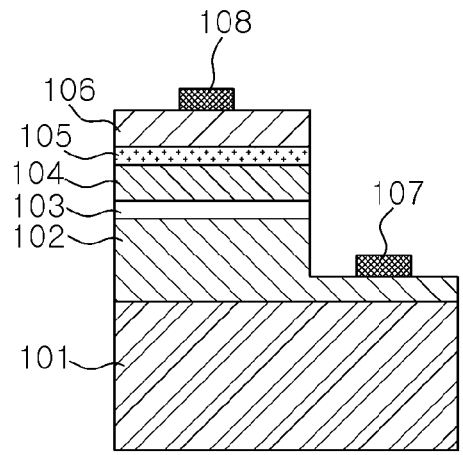

Then, as shown in FIG. 5, after the growth of the second conductivity type nitride semiconductor layer 106 is completed, first and second electrodes 107 and 108 are respectively formed on an exposed surface of the first conductivity type nitride semiconductor layer 102, which is exposed by a partial removal of the light emitting structure, and the second conductivity type nitride semiconductor layer 106. The first and second electrodes 107 and 108 may be formed by the deposition, sputtering or the like of materials known in this technical field, considering the light reflection performance, ohmic contact performance and the like thereof. The shape of the electrodes 107 and 108 as shown in FIG. 5 is merely exemplary. The electrodes 107 and 108 may be formed in various positions on the light emitting structure. For example, without the etching of the light emitting structure, an electrode may be formed on a surface of the first conductivity type nitride semiconductor layer 102 being exposed after the removal of the substrate 101. A light emitting diode, manufactured by the above-stated method, has a structure, in which the undoped nitride semiconductor layer 103 is interposed between the first conductivity type nitride semiconductor layers 102 and 104 to divide the first conductivity type nitride semiconductor layers 102 and 104 into two regions in a thickness direction thereof.

Meanwhile, the semiconductor layers are separately grown using the two reaction chambers 201 and 202 in the above-stated embodiment. However, the number of reaction chambers may be increased as necessary.

Figure 6:
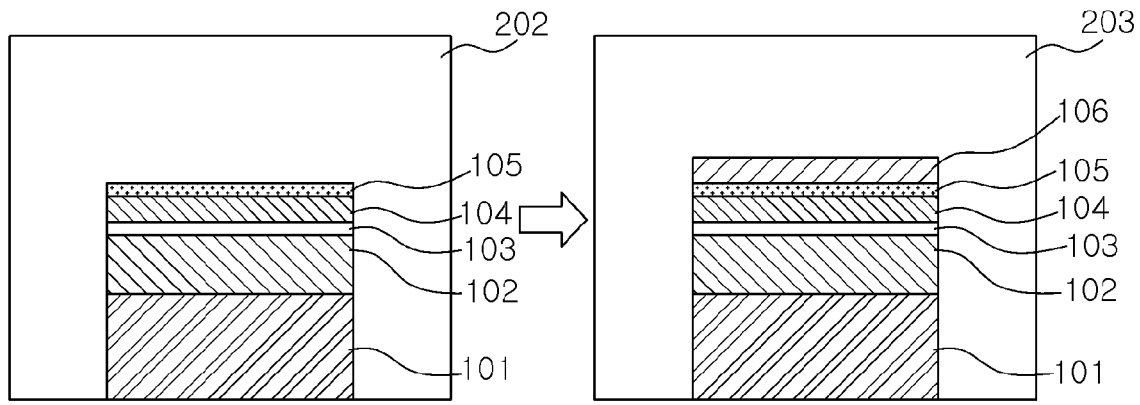
FIGS. 6 and 7 are schematic cross-sectional views illustrating a method of manufacturing a light emitting diode (LED) according to another exemplary embodiment of the present invention.
Figure 7:
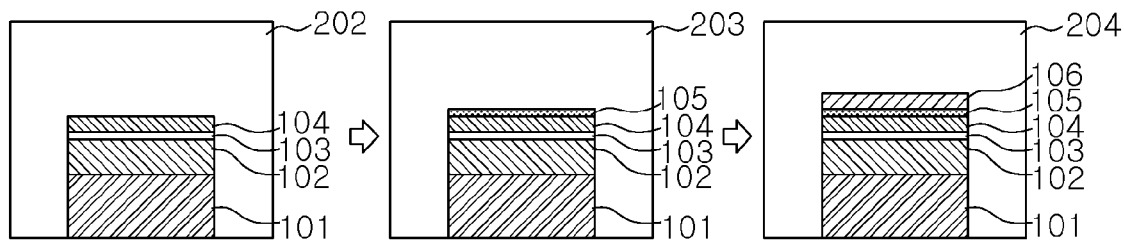

FIGS. 6 and 7 are schematic cross-sectional views illustrating a method of manufacturing a light emitting diode (LED) according to another exemplary embodiment of the present invention. Unlike the previous embodiment, in the case of the embodiment of FIG. 6, after the additional first conductivity type nitride semiconductor layer 104 and the active layer 105 are grown in the second reaction chamber 202, the substrate 101 is transferred to a third reaction chamber 203. This transfer process may be performed in a vacuum state through a load lock chamber such that the active layer 105 may not be damaged. After the transfer of the substrate 101 to the third reaction chamber 203, the second conductivity type nitride semiconductor layer 106 is additionally grown on the active layer 105. As described in the present embodiment, the second conductivity type nitride semiconductor layer 106 may be separately grown in a designated chamber, i.e., the third reaction chamber 203, in which a growth temperature and a source gas atmosphere suitable therefor are maintained, and accordingly, the crystalline characteristics of the second conductivity type nitride semiconductor layer 106 as well as processing efficiency may be improved.

According to the embodiment of FIG. 7, the active layer 105 may also be grown in a designated chamber. Accordingly, an improvement in the crystallinity of the active layer 105 may be expected, which has a large influence on light emitting efficiency. That is, after the additional first conductivity type nitride semiconductor layer 104 is grown in the second reaction chamber 202, the substrate 101 is transferred to the third reaction chamber 203 and the active layer 105 is grown therein. Then, the substrate 101 is transferred to a fourth reaction chamber 204 and the second conductivity type nitride semiconductor layer 106 is grown therein. In the embodiment of FIG. 7, the transfer of the substrate 101 to the third reaction chamber 203 may be performed in a vacuum state through a load lock chamber such that the additional first conductivity type nitride semiconductor layer 104 may not be damaged.

As set forth above, in a method of manufacturing a light emitting diode according to exemplary embodiments of the invention, a system's operational capability and productivity may be improved. In addition, the crystallinity of semiconductor layers obtained by this method may be improved. In particular, in a case in which semiconductor layers constituting a light emitting diode are grown using two or more reaction chambers, pollution of the semiconductor layers may be minimized during the transfer of a substrate.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting diode, the method comprising:

growing a first conductivity type nitride semiconductor layer and an undoped nitride semiconductor layer on a substrate sequentially in a first reaction chamber;

transferring the substrate having the first conductivity type nitride semiconductor layer and the undoped nitride semiconductor layer grown thereon to a second reaction chamber;

growing an additional first conductivity type nitride semiconductor layer on the undoped nitride semiconductor layer in the second reaction chamber;

growing an active layer on the additional first conductivity type nitride semiconductor layer; and growing a second conductivity type nitride semiconductor layer on the active layer.

2. The method of claim 1, wherein part of the undoped nitride semiconductor layer is exposed to the air during the transferring of the substrate to the second reaction chamber.

3. The method of claim 1, wherein the growing of the active layer and the second conductivity type nitride semiconductor layer is performed in the second reaction chamber.

4. The method of claim 1, wherein the growing of the active layer is performed in the second reaction chamber, and the growing of the second conductivity type nitride semiconductor layer includes:

transferring the substrate having the active layer grown thereon to a third reaction chamber; and growing the second conductivity type nitride semiconductor layer on the active layer in the third reaction chamber.

5. The method of claim 1, wherein the growing of the active layer includes:

transferring the substrate having the additional first conductivity type nitride semiconductor layer grown thereon to a third reaction chamber; and growing the active layer on the additional first conductivity type nitride semiconductor layer In the third reaction chamber.

6. The method of claim 5, wherein the growing of the second conductivity type nitride semiconductor layer includes:

transferring the substrate having the active layer grown thereon to a fourth reaction chamber; and growing the second conductivity type nitride semiconductor layer on the active layer in the fourth reaction chamber.

7. The method of claim 1, wherein the first conductivity type nitride semiconductor layer and the additional first conductivity type nitride semiconductor layer are formed of the same material.

8. The method of claim 1, wherein the first conductivity type nitride semiconductor layer and the additional first conductivity type nitride semiconductor layer are formed of n-type GaN, and the undoped nitride semiconductor layer is formed of undoped GaN.

9. The method of claim 1, wherein the first conductivity type nitride semiconductor layer and the undoped nitride semiconductor layer are single layers, and the undoped nitride semiconductor layer is in physical contact with the first conductivity type nitride semiconductor layer.

10. The method of claim 9, wherein the additional first conductivity type nitride semiconductor layer is a single layer and in physical contact with the undoped nitride semiconductor layer.

11. The method of claim 10, wherein the active layer is in physical contact with the additional first conductivity layer.

12. The method of claim 11, wherein the second conductivity type nitride semiconductor layer is in physical contact with the active layer.

13. A method of manufacturing a light emitting diode, the method comprising:

growing a lower first conductivity type nitride semiconductor layer on a substrate in a first reaction chamber;

growing an undoped nitride semiconductor layer on the lower first conductivity type nitride semiconductor layer in the first reaction chamber to protect the lower first conductivity type nitride semiconductor layer;

transferring the substrate having the lower first conductivity type nitride semiconductor layer and the undoped nitride semiconductor layer grown thereon to a second reaction chamber; and growing an upper first conductivity type nitride semiconductor layer on the undoped nitride semiconductor layer in the second reaction chamber.

* * * * *